United States Patent
Vrtis et al.

(10) Patent No.: US 6,846,515 B2
(45) Date of Patent: *Jan. 25, 2005

(54) METHODS FOR USING POROGENS AND/OR POROGENATED PRECURSORS TO PROVIDE POROUS ORGANOSILICA GLASS FILMS WITH LOW DIELECTRIC CONSTANTS

(75) Inventors: Raymond Nicholas Vrtis, Allentown, PA (US); Mark Leonard O'Neill, Allentown, PA (US); Jean Louise Vincent, Bethlehem, PA (US); Aaron Scott Lukas, Allentown, PA (US); Manchao Xiao, San Diego, CA (US); John Anthony Thomas Norman, Encinitas, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 208 days.

This patent is subject to a terminal disclaimer.

(21) Appl. No.: 10/150,798

(22) Filed: May 17, 2002

(65) Prior Publication Data

US 2003/0198742 A1 Oct. 23, 2003

Related U.S. Application Data

(60) Provisional application No. 60/373,104, filed on Apr. 17, 2002.

(51) Int. Cl.[7] ............................................. C23C 16/40
(52) U.S. Cl. .................. 427/255.29; 427/578; 427/294
(58) Field of Search .......................... 427/255.29, 578, 427/294, 255.28

(56) References Cited

U.S. PATENT DOCUMENTS

| | | | |
|---|---|---|---|
| 4,105,821 A | | 8/1978 | Blaich et al. |
| 5,296,624 A | | 3/1994 | Larson et al. |
| 6,054,206 A | | 4/2000 | Mountsier |
| 6,068,884 A | | 5/2000 | Rose et al. |
| 6,171,945 B1 | | 1/2001 | Mandal et al. |
| 6,238,751 B1 | | 5/2001 | Mountsier |
| 6,312,793 B1 | | 11/2001 | Grill et al. |
| 6,583,048 B1 | * | 6/2003 | Vincent et al. ............. 438/623 |
| 6,656,854 B2 | * | 12/2003 | Miyano et al. ............. 438/778 |
| 2004/0102006 A1 | | 5/2004 | Xu et al. |

FOREIGN PATENT DOCUMENTS

| | | |
|---|---|---|
| EP | 1037275 | 9/2000 |
| EP | 1 077 477 A1 | 2/2001 |
| EP | 1119035 | 7/2001 |
| JP | 19900064931 | 3/1990 |
| WO | 0024050 | 4/2000 |
| WO | WO 01/29052 A1 | 4/2001 |
| WO | WO 02/11204 A1 | 2/2002 |
| WO | WO 02/43119 A2 | 5/2002 |

OTHER PUBLICATIONS

Grill, A. and Patel, V., *V. Appl. Phys. Lett.* (2001), 79(6), pp. 803–805.
A. Grill, et al., "Novel Low–k Dual–phase Materials Prepared by PECVD," Mat. Res. Soc. Symp. Proc. vol. 612, 2000 Materials Research Society, Yorktown Heights, NY.
A. Grill, et al., "SiCOH Dielectrics: From Low–K to Ultralow–K by PECVD," Conference Proceedings ULSI XVII, 2002 Materials Research Society, Yorktown Heights, NY.
A. Grill, et al., "Low Dielectric Constant SiCOH Films as Potential Candidates for Interconnect Dielectrics," Mat. Res. Soc. Symp. Proc. vol. 565, 1999 Materials Research Society, Yorktown Heights, NY.
A. Grill, et al., "Ultralow–k dielectrics prepared by plasma–enhanced chemical vapor deposition," Applied Physics Letters, vol. 79, No. 6, 2001, Yorktown Heights, NY.
European Search Report No. 03008723.3–2119 dated Aug. 12, 2003.

* cited by examiner

*Primary Examiner*—Bret Chen
(74) *Attorney, Agent, or Firm*—Rosaleen P. Morris-Oskanian

(57) ABSTRACT

A method for providing a porous organosilica glass (OSG) film that consists of a single phase of a material represented by the formula $Si_vO_wC_xH_yF_z$, $v+w+x+y+z=100\%$, v is from 10 to 35 atomic %, w is from 10 to 65 atomic %, x is from 5 to 30 atomic %, y is from 10 to 50 atomic % and z is from 0 to 15 atomic %, wherein the film has pores and a dielectric constant less than 2.6 is disclosed herein. In one aspect of the present invention, the film is provided by a chemical vapor deposition method in which a preliminary film is deposited from organosilane and/or organosiloxane precursors and pore-forming agents (porogens), which can be independent of, or alternatively bonded to, the precursors. The porogens are subsequently removed to provide the porous film. In another aspect of the present invention, porogenated precursors are used for providing the film.

99 Claims, 4 Drawing Sheets

METHODS FOR USING POROGENS AND/OR POROGENATED PRECURSORS TO PROVIDE POROUS ORGANOSILICA GLASS FILMS WITH LOW DIELECTRIC CONSTANTS

CROSS-REFERENCES TO RELATED APPLICATIONS

This application claims priority from provisional U.S. Patent Application No. 60/373,104 filed Apr. 17, 2002.

BACKGROUND OF THE INVENTION

The present invention is directed to the field of low dielectric constant materials produced by CVD methods as insulating layers in electronic devices.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. C is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating silicon oxide film with organic groups providing dielectric constants in the range of 2.7–3.5. This organosilica glass is typically deposited as a dense film (density~1.5 $g/cm^3$) from an organosilicon precursor, such as a methylsilane or siloxane, and an oxidant, such as $O_2$ or $N_2O$. Organosilica glass will be herein be referred to as OSG. As dielectric constant or "k" values drop below 2.7 with higher device densities and smaller dimensions, the industry has exhausted most of the suitable low k compositions for dense films and has turned to various porous materials for improved insulating properties.

The patents and applications which are known in the field of porous ILD by CVD methods field include: EP 1 119 035 A2 and U.S. Pat. No. 6,171,945, which describe a process of depositing an OSG film from organosilicon precursors with labile groups in the presence of an oxidant such as $N_2O$ and optionally a peroxide, with subsequent removal of the labile group with a thermal anneal to provide porous OSG; U.S. Pat. Nos. 6,054,206 and 6,238,751, which teach the removal of essentially all organic groups from deposited OSG with an oxidizing anneal to obtain porous inorganic $SiO_2$; EP 1 037 275, which describes the deposition of an hydrogenated silicon carbide film which is transformed into porous inorganic $SiO_2$ by a subsequent treatment with an oxidizing plasma; and U.S. Pat. No. 6,312,793 B1, WO 00/24050, and a literature article Grill, A. Patel, V. Appl. Phys. Left. (2001), 79(6), pp. 803–805, which all teach the co-deposition of a film from an organosilicon precursor and an organic compound, and subsequent thermal anneal to provide a multiphase OSG/organic film in which a portion of the polymerized organic component is retained. In these latter references the ultimate final compositions of the films indicate residual porogen and a high hydrocarbon film content (80–90 atomic %). It is preferable that the final film retain the $SiO_2$-like network, with substitution of a portion of oxygen atoms for organic groups.

All references disclosed herein are incorporated by reference herein in their entireties.

BRIEF SUMMARY OF THE INVENTION

The present invention provides a porous organosilica glass film consisting of a single phase of a material represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, wherein the film has pores and a dielectric constant less than 2.6.

The present invention further provides a chemical vapor deposition method for producing the porous organosilica glass film of the invention, comprising: (a) providing a substrate within a vacuum chamber; (b) introducing into the vacuum chamber gaseous reagents including at least one precursor gas selected from the group consisting of an organosilane and an organosiloxane, and a porogen distinct from the at least one precursor gas; (c) applying energy to the gaseous reagents in the vacuum chamber to induce reaction of the gaseous reagents to deposit a preliminary film on the substrate, wherein the preliminary film contains the porogen, and the preliminary film is deposited without added oxidants; and (d) removing from the preliminary film substantially all of the porogen to provide the porous film with pores and a dielectric constant less than 2.6.

Still further provided is a chemical vapor deposition method for producing the porous organosilica glass film of the invention, comprising: (a) providing a substrate within a vacuum chamber; (b) introducing into the vacuum chamber gaseous reagents including at least one precursor gas selected from the group consisting of a organosilane and an organosiloxane, wherein the at least one precursor gas contains at least one porogen bonded thereto; (c) applying energy to the gaseous reagents in the vacuum chamber to induce reaction of the gaseous reagents to deposit a preliminary film on the substrate, wherein the preliminary film contains the at least one porogen and a first quantity of methyl groups bonded to silicon atoms; and (d) removing from the preliminary film at least a portion of the at least one porogen to provide the porous film with pores and a dielectric constant less than 2.6, wherein the porous film contains a second quantity of methyl groups bonded to silicon atoms, and the second quantity is more than 50% of the first quantity.

Also provided are novel porogenated precursors for producing porous organosilica glass films, including porogenated 1,3,5,7-tetramethylcyclo-tetrasiloxanes, such as neohexyl-1,3,5,7-tetramethylcyclo-tetrasiloxane and trimethylsilylethyl-1,3,5,7-tetramethylcyclo-tetrasiloxane.

Still further provided are novel compositions containing porogens and precursors for producing the films of the invention.

DETAILED DESCRIPTION OF THE INVENTION

Figure 1:
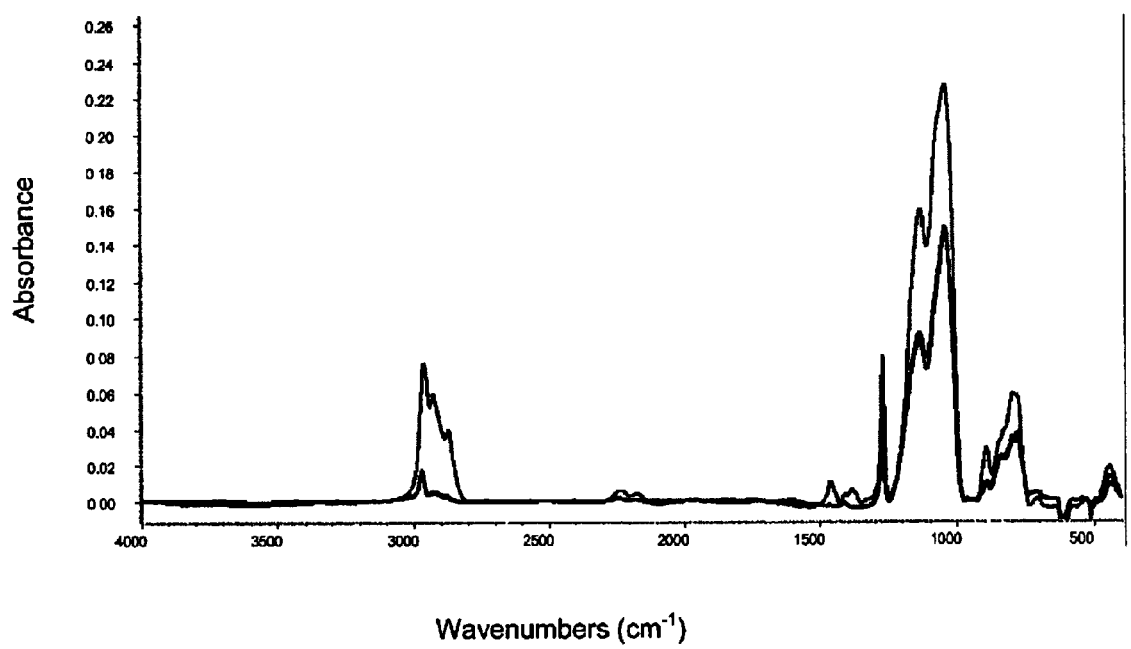
FIG. 1 shows infrared spectra of a film of the present invention using thermally labile group admixed therewith before and after a post anneal indicating the elimination of the thermally labile group.

Organosilicates are candidates for low k materials, but without the addition of porogens to add porosity to these materials, their inherent dielectric constant is limited to as low as 2.7. The addition of porosity, where the void space has an inherent dielectric constant of 1.0, reduces the overall dielectric constant of the film, generally at the cost of mechanical properties. Materials properties depend upon the chemical composition and structure of the film. Since the type of organosilicon precursor has a strong effect upon the film structure and composition, it is beneficial to use precursors that provide the required film properties to ensure that the addition of the needed amount of porosity to reach the desired dielectric constant does not produce films that are mechanically unsound. Thus, the invention provides the means to generate porous OSG films that have a desirable balance of electrical and mechanical properties. Other film properties often track with electrical or mechanical properties.

Preferred embodiments of the invention provide a thin film material having a low dielectric constant and improved-mechanical properties, thermal stability, and chemical resistance (to oxygen, aqueous oxidizing environments, etc.) relative to other porous organosilica glass materials. This is the result of the incorporation into the film of carbon (preferably predominantly in the form of organic carbon, —$CH_x$, where x is 1 to 3, more preferably the majority of C is in the form of —$CH_3$) whereby specific precursor or network-forming chemicals are used to deposit films in an environment free of oxidants (other than the optional additive/carrier gas $CO_2$, to the extent it is deemed to function as an oxidant).

Thus, preferred embodiments of the invention comprise: (a) about 10 to about 35 atomic %, more preferably about 20 to about 30% silicon; (b) about 10 to about 65 atomic %, more preferably about 20 to about 45 atomic % oxygen; (c) about 10 to about 50 atomic %, more preferably about 15 to about 40 atomic % hydrogen; (d) about 5 to about 30 atomic %, more preferably about 5 to about 20 atomic % carbon. Films may also contain about 0.1 to about 15 atomic %, more preferably about 0.5 to about 7.0 atomic % fluorine, to improve one or more of materials properties. Lesser portions of other elements may also be present in certain films of the invention. OSG materials are considered to be low k materials as their dielectric constant is less than that of the standard material traditionally used in the industry—silica glass. The materials of the invention can be provided by adding pore-forming species or porogens to the deposition procedure, incorporating the porogens into the as-deposited (i.e., preliminary) OSG film and removing substantially all of the porogens from the preliminary film while substantially retaining the terminal Si—$CH_3$ groups of the preliminary film to provide the product film. The product film is porous OSG and has a dielectric constant reduced from that of the preliminary film as well as from an analogous film deposited without porogens. It is important to distinguish the film of the present invention as porous OSG, as opposed to a porous inorganic $SiO_2$, which lacks the hydrophobicity provided by the organic groups in OSG.

Silica produced by PE-CVD TEOS has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably less than 5 nm in equivalent spherical diameter, more preferably less than 2.5 nm in equivalent spherical diameter.

Total porosity of the film may be from 5 to 75% depending upon the process conditions and the desired final film properties. Films of the invention preferably have a density of less than 2.0 g/ml, or alternatively, less than 1.5 g/ml or less than 1.25 g/ml. Preferably, films of the invention have a density at least 10% less than that of an analogous OSG film produced without porogens, more preferably at least 20% less.

The porosity of the film need not be homogeneous throughout the film. In certain embodiments, there is a porosity gradient and/or layers of varying porosities. Such films can be provided by, e.g., adjusting the ratio of porogen to precursor during deposition.

Films of the invention have a lower dielectric constant relative to common OSG materials. Preferably, films of the invention have a dielectric constant at least 0.3 less than that of an analogous OSG film produced without porogens, more preferably at least 0.5 less.

Films of the invention preferably have superior mechanical properties relative to common OSG materials. Preferably, the base OSG structure of the films of the invention (e.g., films that have not had any added porogen) have a hardness or modulus measured by nanoindentation at least 10% greater, more preferably 25% greater, than that of an analogous OSG film at the same dielectric constant.

Films of the invention do not require the use of an oxidant to deposit a low k film. The absence of added oxidant to the gas phase, which is defined for present purposes as a moiety that could oxidize organic groups (e.g., $O_2$, $N_2O$, ozone, hydrogen peroxide, NO, $NO_2$, $N_2O_4$, or mixtures thereof), facilitates the retention of the methyl groups of the precursor in the film. This allows the incorporation of the minimum amount of carbon necessary to provide desired properties, such as reduced dielectric constant and hydrophobicity. As well, this tends to provide maximum retention of the silica network, providing films that have superior mechanical properties, adhesion, and etch selectivity to common etch stop materials (e.g., silicon carbide, hydrogenated silicon carbide, silicon nitride, hydrogenated silicon nitride, etc.), since the film retains characteristics more similar to silica, the traditional dielectric insulator.

Films of the invention may also contain fluorine, in the form of inorganic fluorine (e.g., Si—F). Fluorine, when present, is preferably contained in an amount ranging from 0.5 to 7 atomic %.

Films of the invention are thermally stable, with good chemical resistance. In particular, preferred films after anneal have an average weight loss of less than 1.0 wt %/hr isothermal at 425° C. under $N_2$. Moreover, the films preferably have an average weight loss of less than 1.0 wt %/hr isothermal at 425° C. under air.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film is an insulation layer, an interlayer dielectric layer, an intermetal dielectric layer, a capping layer, a chemical-mechanical planarization or etch stop layer, a barrier layer or an adhesion layer in an integrated circuit.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits. Preferably, the substrate is a semiconductor.

In addition to the inventive OSG products, the present invention includes the process by which the products are made, methods of using the products and compounds and compositions useful for preparing the products.

It is within the scope of the invention for a single species of molecule to function as both the structure-former and porogen. That is, the structure-forming precursor and the pore-forming precursor are not necessarily different molecules, and in certain embodiments the porogen is a part of (e.g., covalently bound to) the structure-forming precursor. Precursors containing porogens bound to them are sometimes referred to hereinafter as "porogenated precursors". For example, it is possible to use neohexyl TMCTS as a single species, whereby the TMCTS portion of the molecule forms the base OSG structure and the bulky alkyl substituent neohexyl is the pore forming species which is removed during the anneal process. Having the porogen attached to a Si species that will network into the OSG structure may be advantageous in achieving a higher efficiency of incorporation of porogen into the film during the deposition process. Furthermore, it may also be advantageous to have two porogens attached to one Si in the precursor, such as in di-neohexyl-diethoxysilane, or two Si's attached to one porogen, such as in 1,4-bis(diethoxysilyl)cylcohexane, since the most likely bond to break in a plasma during the deposition process is the Si-Porogen bond. In this manner, reaction of one Si-Porogen bond in the plasma will still result in incorporation of the porogen in the deposited film.

In certain embodiments of the materials in which a single or multiple porogen is attached to a silicon, it may be advantageous to design the porogen in such as way that when the film is cured to form the pores, a part of the porogen remains attached to the silicon to impart hydrophobicity to the film. The porogen in a precursor containing Si-Porogen may be chosen such that decomposition or curing leaves attached to the Si a terminal chemical group from the porogen, such as a —$CH_3$. For example, if the porogen neopentyl is chosen, it is expected that thermal annealing under the proper conditions would cause bond breakage at the C—C bonds beta to the Si, that is the bond between the secondary carbon adjacent to Si and the quaternary carbon of the t-butyl group will thermodynamically be the most favorable bond to break. Under proper conditions this would leave a terminal —$CH_3$ group to satisfy the Si, as well as provide hydrophobicity and a low dielectric constant to the film. Examples of precursors are neopentyl triethoxysilane, neopentyl diethoxy silane, and neopentyl diethoxymethylsilane.

The porogen in the deposited film may or may not be in the same form as the porogen introduced to the reaction chamber. As well, the porogen removal process may liberate the porogen or fragments thereof from the film. In essence, the porogen reagent (or porogen substituent attached to the precursor), the porogen in the preliminary film, and the porogen being removed may or may not be the same species, although it is preferable that they all originate from the porogen reagent (or porogen substituent). Regardless of whether or not the porogen is unchanged throughout the inventive process, the term "porogen" as used herein is intended to encompass pore-forming reagents (or pore-forming substituents) and derivatives thereof, in whatever forms they are found throughout the entire process of the invention.

Other aspects of this invention are novel organosilanes and organosiloxanes. Novel porogen-containing (i.e., porogenated) materials synthesized for use as low dielectric constant precursors, such as neohexyl TMCTS and trimethylsilylethyl TMCTS, may also have potential applications in other areas. The novel organosilanes of this invention are easily prepared by hydrosilylation reactions of the olefin precursor with either TMCTS or diethoxymethylsilane. For example, dropwise addition of either diethoxymethylsilane or TMCTS to a molar equivalent of distilled 3,3-dimethylbutene in the presence of chloroplatinic acid catalyst affords the neohexyl-substituted silanes neohexyl diethoxymethylsilane and neohexyl tetramethylcyclotetrasiloxane in high yields.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In addition, the reagents can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In certain embodiments, mixtures of different organosilanes and/or organosiloxanes are used in combination. It is also within the scope of the invention to use combinations of multiple different porogens, and organosilanes and/or organosiloxanes in combination with organosilane and/or organosiloxane species with attached porogens. Such embodiments facilitate adjusting the ratio of pores to Si in the final product, and/or enhance one or more critical properties of the base OSG structure. For example, a deposition utilizing diethoxymethylsilane (DEMS) and porogen might use an additional organosilicon such as tetraethoxysilane (TEOS) to improve the film mechanical strength. A similar example may be the use of DEMS added to the reaction using the organosilicon neohexyl-diethoxymethylsilane, where the neohexyl group bound to the precursor functions as the porogen. A further example would be the addition of di-tert-butoxy-diacetoxysilane to the reaction using di-tert-butoxymethylsilane+porogen.

In addition to the structure forming species and the pore-forming species, additional materials can be charged into the vacuum chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film) and reactive substances, such as gaseous or liquid organic substances, $NH_3$, $H_2$, $CO_2$, or CO. $CO_2$ is the preferred carrier gas.

Energy is applied to the gaseous reagents to induce the gases to react and to form the film on the substrate. Such energy can be provided by, e.g., thermal, plasma, pulsed plasma, helicon plasma, high density plasma, inductively coupled plasma, and remote plasma methods. A secondary rf frequency source can be used to modify the plasma characteristics at the substrate surface. Preferably, the film is formed by plasma enhanced chemical vapor deposition. It is particularly preferred to generate a capacitively coupled plasma at a frequency of 13.56 MHz. Plasma power is preferably from 0.02 to 7 watts/cm$^2$, more preferably 0.3 to 3 watts/cm$^2$, based upon a surface area of the substrate. It may be advantageous to employ a carrier gas which possesses a low ionization energy to lower the electron temperature which in turn will cause less fragmentation in the OSG precursor and porogen. Examples of this type of low ionization gas include $CO_2$, $NH_3$, CO, $CH_4$, Ar, Xe, Kr.

The flow rate for each of the gaseous reagents preferably ranges from 10 to 5000 sccm, more preferably from 30 to 1000 sccm, per single 200 mm wafer. The individual rates are selected so as to provide the desired amounts of structure-former and pore-former in the film. The actual flow rates needed may depend upon wafer size and chamber configuration, and are in no way limited to 200 mm wafers or single wafer chambers.

It is preferred to deposit the film at a deposition rate of at least 50 nm/min.

The pressure in the vacuum chamber during deposition is preferably 0.01 to 600 torr, more preferably 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k<2.0).

The removal of substantially all porogen is assumed if there is no statistically significant measured difference in atomic composition between the annealed porous OSG and the analogous OSG without added porogen. The inherent measurement error of the analysis method for composition (e.g., X-ray photoelectron spectroscopy (XPS), Rutherford Backscattering/Hydrogen Forward Scattering (RBS/HFS)) and process variability both contribute to the range of the data. For XPS the inherent measurement error is Approx.+/−2 atomic %, while for RBS/HFS this is expected to be larger, ranging from+/−2 to 5 atomic % depending upon the species. The process variability will contribute a further+/−2 atomic % to the final range of the data.

The following are non-limiting examples of Si-based precursors suitable for use with a distinct porogen. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1{}_n(OR^2)_{4-n}Si$, when n is 2 or 3, the two or three $R^1$ groups need not be identical to each other or to $R^2$.

—$R^1{}_n(OR^2)_{4-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated, n is 1 to 3.

Example: diethoxymethylsilane, dimethyldimethoxysilane

—$R^1{}_n(OR^2)_{3-n}Si$—O—$SiR^3{}_m(OR^4)_{3-m}$ where $R^1$ and $R^3$ can be independently H, C, to $C_4$, linear or branched, saturated, singly or multiply unsaturated, cyclic, partially or fully fluorinated; $R^2$ and $R^4$ can be independently C, to $C_6$, linear or branched, saturated, singly or multiply unsaturated, cyclic, aromatic, partially or fully fluorinated, n is 1 to 3 and m is 1 to 3.

Example: 1,3-dimethyl-1,3-diethoxydisiloxane

—$R^1{}_n(OR^2)_{3-n}Si$—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraethoxydisilane

—$R^1{}_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, n is 1 to 3.

Example: dimethyldiacetoxysilane

—$R^1{}_n(O(O)CR^2)_{3-n}Si$—O—$SiR^3{}_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diacetoxydisiloxane

—$R^1{}_n(O(O)CR^2)_{3-n}Si$—$SiR^3{}_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraacetoxydisilane

—$R^1{}_n(O(O)CR^2)_{3-n}Si$—O—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1-acetoxy-3-ethoxydisiloxane

—$R^1{}_n(O(O)CR^2)_{3-n}Si$—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1-acetoxy-2-ethoxydisilane

—$R^1{}_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^4$ can be independently H, $C_1$ to $C_6$, linear or branched, saturated, singly or multiply unsaturated, cyclic, aromatic, partially or fully fluorinated, and n is 1 to 3 and p is 1 to 3.

Example: methylacetoxy-t-butoxysilane

—$R^1{}_n(OR^2)_p(O(O)CR^4)_{3-n-p}Si$—O—$SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated, $R^4$ and $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-dimethyl-1,3-diacetoxy-1,3-diethoxydisiloxane

—$R^1{}_n(OR^2)_p(O(O)CR^4)_{3-n-p}Si$—$SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$, $R^6$ can be independently C, to $C_6$, linear or branched, saturated, singly or multiply unsaturated, cyclic, aromatic, partially or fully fluorinated, $R^4$, $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-dimethyl-1,2-diacetoxy-1,2-diethoxydisilane

-cyclic siloxanes of the formula $(OSiR_{1R3})_x$, where $R^1$ and $R^3$ can be independently H, $C_1$ to $C_4$, linear or branched, saturated, singly or multiply unsaturated, cyclic, partially or fully fluorinated, and x may be any integer from 2 to 8.

Examples: 1,3,5,7-tetramethylcyclotetrasiloxane, octamethylcyclotetrasiloxane

Provisos to all above precursor groups: 1) there is not more than one Si—H per Si atom, 2) the reaction environment is essentially non-oxidative and/or has no oxidant added to the reaction mixture (other than the optional addition of $CO_2$ to the extent it is deemed an oxidant), 3) a porogen is added to the reaction mixture, and 4) a curing (e.g., anneal) step is used to remove substantially all of the included porogen from the deposited film to produce a k<2.6.

The above precursors may be mixed with porogen or have attached porogens, and may be mixed with other molecules of these classes and/or with molecules of the same classes except where n and/or m are from 0 to 3.

Examples: TEOS, silane, disilane, di-tert-butoxydiacetoxysilane, etc.

Although reference is made throughout the specification to siloxanes and disiloxanes as precursors and porogenated precursors, it should be understood that the invention is not limited thereto, and that other siloxanes, such as trisiloxanes and other linear siloxanes of even greater length, are also within the scope of the invention.

The following are non-limiting examples of Si-based porogenated precursors, where the porogen material is one or more of $R^1$, $R^3$ or $R^7$:

—$R^1{}_n(OR^2)4$–n Si where $R^1$ can be independently H, $C_1$ to $C_{12}$, linear or branched, saturated, singly or multiply unsaturated, cyclic, partially or fully fluorinated; $R^2$ can be independently $C_1$ to $C_{12}$, linear or branched, saturated, singly or multiply unsaturated, cyclic, aromatic, partially or fully fluorinated, n is 1 to 3.

Example: diethoxy-neo-hexylsilane

—$R^1{}_n(OR^2)_{3-n}Si$—O—$SiR^3{}_m(OR^4)_{3-n}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1,3-diethoxy-1-neo-hexyldisiloxane

—$R^1{}_n(OR^2)_{3-n}Si$—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1,2-diethoxy-1-neo-hexyldisilane

—$R^1{}_n(OR^2)_{3-n}Si$—R $7SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, $R^7$ is $C_1$ to $C_{12}$, linear or branched, saturated, singly or multiply unsaturated, cyclic, partially or fully fluorinated, and bridges the two Si atoms, n is 1 to 3 and m is 1 to 3.

Example: 1,4-bis(dimethoxysilyl)cyclohexane

—$R^1{}_n(OR^2)_{3-n}Si$—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1,2-diethoxy-1-neo-hexyldisilane

—$R^1{}_n(O(O)CR^2)4$–n Si where $R^1$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, n is 1 to 3.

Example: diacetoxy-neo-hexylsilane

—$R^1{}_n(O(O)CR^2)_{3-n}Si$—O—$SiR^3{}_m(O(O)CR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently H, $C_1$ to $C_{12}$, linear or branched, saturated, singly or multiply unsaturated, cyclic, aromatic, partially or fully fluorinated, n is 1 to 3 and m is 1 to 3.

Example: 1,3-diacetoxy-1-neo-hexyldisiloxane

—$R^1{}_n(O(O)CR^2)3$–n Si—$SiR^3{}_m(O(O)CR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently H, $C_1$ to $C_{12}$, linear or branched, saturated, singly or multiply unsaturated, cyclic, aromatic, partially or fully fluorinated, n is 1 to 3 and m is 1 to 3.

Example: 1,2-diacetoxy-1-neo-hexyldisilane

—$R_{1n}(O(O)CR^2)_{3-n}Si$—O—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1-acetoxy-3,3-di-t-butoxy-1-neohexyldisiloxane

—$R^1{}_n(O(O)CR^2)_{3-n}Si$—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1-acetoxy-2,2-di-t-butoxy-1-neohexyldisilane

—$R^1{}_n(OR^2)_p(O(O)CR^3)_{4-n+p})Si$ where $R^1$ can be independently H, $C_1$ to $C_{12}$, linear or branched, saturated, singly or multiply unsaturated, cyclic, partially or fully fluorinated; $R^2$ can be independently $C_1$ to $C_{12}$, linear or branched, saturated, singly or multiply unsaturated, cyclic, aromatic, partially or fully fluorinated; $R^3$ can be independently H, $C_1$ to $C_{12}$, linear or branched, saturated, singly or multiply unsaturated, cyclic, aromatic, partially or fully fluorinated, and n is 1 to 3 and p is 1 to 3.

Example: acetoxy-t-butoxy-neo-hexylsilane

—$R^1{}_n(OR^2)_p(O(O)CR^4)_{3-n-p}Si$—O—$SiR^3{}_m(O(O)CR^5)_q (OR^6)_{3-m-q}$ where $R^1$ and $R^3$ can be independently H, $C_1$ to $C_{12}$, linear or branched, saturated, singly or multiply unsaturated, cyclic, partially or fully fluorinated; $R^2$, $R^6$ can be independently $C_1$ to $C_{12}$, linear or branched, saturated, singly or multiply unsaturated, cyclic, aromatic, partially or fully fluorinated, $R^4$, $R^5$ can be independently H, $C_1$ to $C_{12}$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-diacetoxy-1,3-di-t-butoxy-1-neohexyldisiloxane

—$R^1{}_n(OR^2)_p(O(O)CR^4)_{3-n-p}Si$—$SiR^3{}_m(O(O)CR^5)_q (OR^6)_{3-m-q}$ where $R^1$ and $R^3$ can be independently H, $C_1$ to $C_{12}$, linear or branched, saturated, singly or multiply unsaturated, cyclic, partially or fully fluorinated; $R^2$, $R^6$ can be independently $C_1$ to $C_{12}$, linear or branched, saturated, singly or multiply unsaturated, cyclic, aromatic, partially or fully fluorinated, $R^4$, $R^5$ can be independently H, $C_1$ to $C_{12}$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-diacetoxy-1,2-di-t-butoxy-1-neohexyldisilane

-cyclic siloxanes of the formula $(OSiR_1R_3)_x$, where $R^1$ and $R^3$ can be independently H, $C_1$ to $C_{12}$, linear or branched, saturated, singly or multiply unsaturated, cyclic, partially or fully fluorinated, and x may be any integer from 2 to 8.

Example: such as 1-neohexyl-1,3,5,7-tetramethylcyclotetrasiloxane

Provisos to all above groups: 1) there is not more than one Si—H per Si atom, 2) the reaction environment is essentially non-oxidative and/or has no added oxidant (other than the optional addition of $CO_2$ to the extent it is deemed an oxidant) to the reaction mixture, 3) it is preferred that at least one of $R^1$, $R^3$ and $R^7$ have a $C_3$ or larger hydrocarbon to act as pore former, and 4) a curing step (e.g., thermal annealing) is used to remove at least a portion of the included porogen, and preferably substantially all of the included porogen, from the deposited film to produce a dielectric constant less than 2.6.

The above precursors may be mixed with other molecules of these same classes and/or with molecules of the same classes except where n and/or m are from 0 to 3.

The following are non-limiting examples of materials suitable for use as porogens of the invention:

1) Cyclic hydrocarbons of the general formula $C_nH_{2n}$ where n=4–14, where the number of carbons in the cyclic structure is between 4 and 10, and where there can be a plurality of simple or branched hydrocarbons substituted onto the cyclic structure.

Examples include: cyclohexane, trimethylcyclohexane, 1-methyl-4(1-methylethyl)cyclohexane, cyclooctane, methylcyclooctane 2) Singly or multiply unsaturated cyclic hydrocarbons of the general formula $C_nH_{2n-2x}$ where x is the number of unsaturated sites in the molecule, n=4–14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure.

Examples include cyclohexene, vinylcyclohexane, dimethylcyclohexene, t-butylcyclohexene, alpha-terpinene, pinene, 1,5-dimethyl-1,5-cyclooctadiene, vinylcyclohexene, 3) Bicyclic hydrocarbons of the general formula $C_nH_{2n-2}$ where n=4–14, where the number of carbons in the bicyclic structure is between 4 and 12, and where there can be a plurality of simple or branched hydrocarbons substituted onto the cyclic structure.

Examples include, norbornane, spiro-nonane, decahydronaphthalene, etc.

4) Multiply unsaturated bicyclic hydrocarbons of the general formula $C_nH_{2n-(2+2x)}$ where x is the number of unsaturated sites in the molecule, n=4–14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure.

Examples include camphene, norbornene, norbornadiene, etc.

5) Tricyclic hydrocarbons of the general formula $C_nH_{2n-4}$ where n=4–14, where the number of carbons in the tricyclic structure is between 4 and 12, and where there can be a plurality of simple or branched hydrocarbons substituted onto the cyclic structure.

Examples include adamantane.

The porogen is removed from the preliminary (or as-deposited) film by a curing step, which can comprise thermal annealing, chemical treatment, in-situ or remote plasma treating, photocuring and/or microwaving. Other in-situ or post-deposition treatments may be used to enhance materials properties.

Annealing is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. The temperature is preferably 200–500° C., and the temperature ramp rate is from 0.1 to 100 deg ° C/min. The total annealing time is preferably from 0.01 min to 12 hours.

Chemical treatment of the OSG film is conducted under the following conditions.

The use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material.

Plasma treating for selective removal of labile groups and possible chemical modification of the OSG film is conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0–5000 W. The temperature is preferably ambient to 500° C. The pressure is preferably 10 mtorr to atmospheric pressure. The total curing time is preferably 0.01 min to 12 hours.

Photocuring for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths <200 nm). The total curing time is preferably 0.01 min to 12 hours.

Microwave post-treatment for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

The invention will be illustrated in more detail with reference to the following Examples, but it should be understood that the present invention is not deemed to be limited thereto.

EXAMPLES

All experiments were performed on an Applied Materials Precision-5000 system in a 200 mm DxZ chamber fitted with an Advance Energy 2000 rf generator, using an undoped TEOS process kit. The recipe involved the following basic steps: initial set-up and stabilization of gas flows, deposition, and purge/evacuation of chamber prior to wafer removal. Films were annealed in a tube furnace at 425° C. for 4 hours under $N_2$.

Thickness and refractive index were measured on an SCI Filmtek 2000 Reflectometer. Dielectric constants were determined using Hg probe technique on low resistivity p-type wafers (<0.02 ohm-cm). Mechanical properties were determined using MTS Nano Indenter. Thermal stability and off-gas products were determined by thermogravimetric analysis on a Thermo TA Instruments 2050 TGA. Compositional data were obtained by x-ray photoelectron spectroscopy (XPS) on a Physical Electronics 5000LS. The atomic % values reported in the tables do not include hydrogen.

Three routes were chosen for introducing porosity into an OSG film. The first route investigated to produce low k films with k<2.6 co-deposited a thermally labile organic oligomer as the porogen along with the OSG by plasma enhanced chemical vapor deposition (PECVD) and then removed the oligomer post-deposition in a thermal annealing step.

Example 1A

Figure 4:
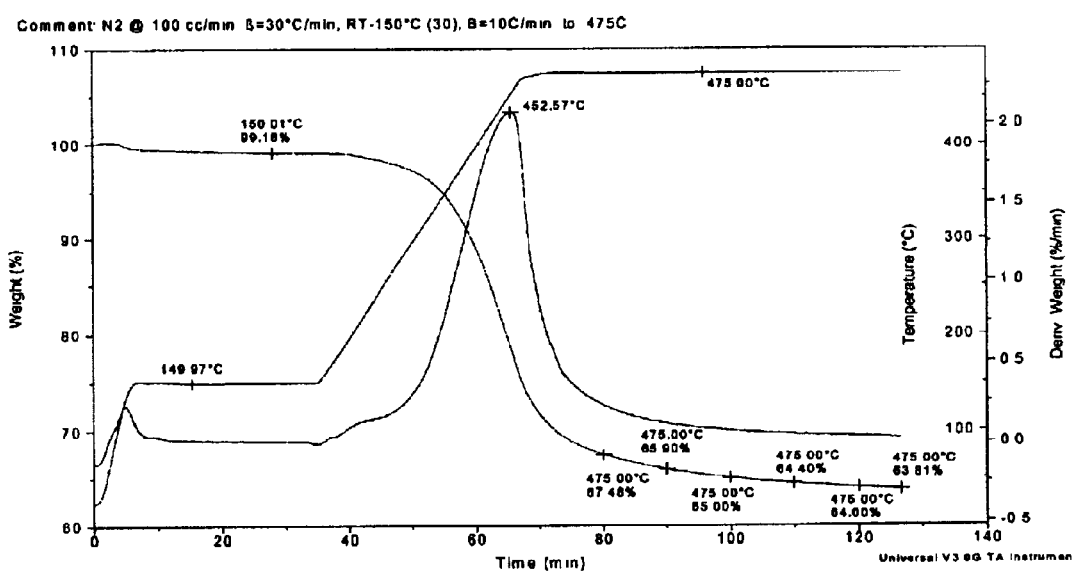
FIG. 4 is a thermogravimetric analysis of the film of the present invention during anneal indicating weight loss resulting from the loss of thermally labile group from the film.

Alpha-terpinene (ATP) was co-deposited with diethoxymethylsilane (DEMS) onto a silicon wafer via PECVD in an oxidant-free environment. The process conditions were 700 miligrams per minute (mgm) flow of a 39.4% (by volume) mixture of ATP in DEMS. A carrier gas flow of 500 sccm of $CO_2$ was used to escort the chemicals into the deposition chamber. Further process conditions were as follows: a chamber pressure of 5 Torr, wafer chuck temperature of 150° C., showerhead to wafers spacing of 0.26 inches, and plasma power of 300 watts for a period of 180 seconds. The film as deposited had a thickness of 650 nm and a dielectric constant of 2.8. The film was annealed at 425° C. under nitrogen for 4 hours to remove substantially all of the incorporated ATP, as evidenced by XPS. FIG. 1 shows infrared spectra of the film before (light line) and after (dark line) annealing, indicating the elimination of the porogen. The annealed film had a thickness of 492 nm and a dielectric constant of 2.4 (see Table 2 below). FIG. 4 shows a thermogravimetric analysis of the film to demonstrate weight loss occurring during thermal treatments.

Example 1B

ATP was co-deposited with DEMS onto a silicon wafer via PECVD in an oxidant-free environment. The process conditions were 1300 miligrams per minute (mgm) flow of a 70% (by volume) mixture of alpha-terpinene in DEMS. A carrier gas flow of 500 sccm of $CO_2$ was used to entrain the chemicals into the gas flow into the deposition chamber. Further process conditions were as follows: a chamber pressure of 8 Torr, wafer chuck temperature of 200° C., showerhead to wafers spacing of 0.30 inches, and plasma power of 600 watts for a period of 120 seconds. The film as deposited had a thickness of 414 nm and a dielectric constant of 2.59. The film was annealed at 425° C. under nitrogen for 4 hours to remove substantially all the incorporated ATP. The annealed film had a thickness of 349 nm and a dielectric constant of 2.14 (see Table 2 below).

Example 1C

Figure 2:
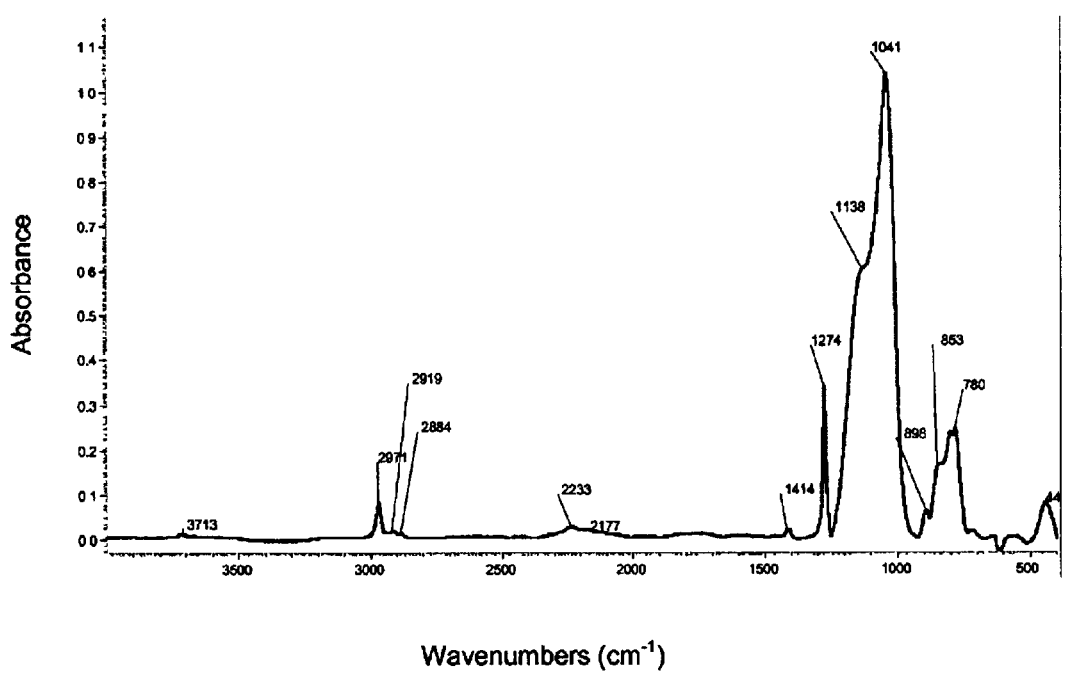
FIG. 2 is an infrared spectrum of the film of the present invention identifying the peaks of the components of the film.
Figure 3:
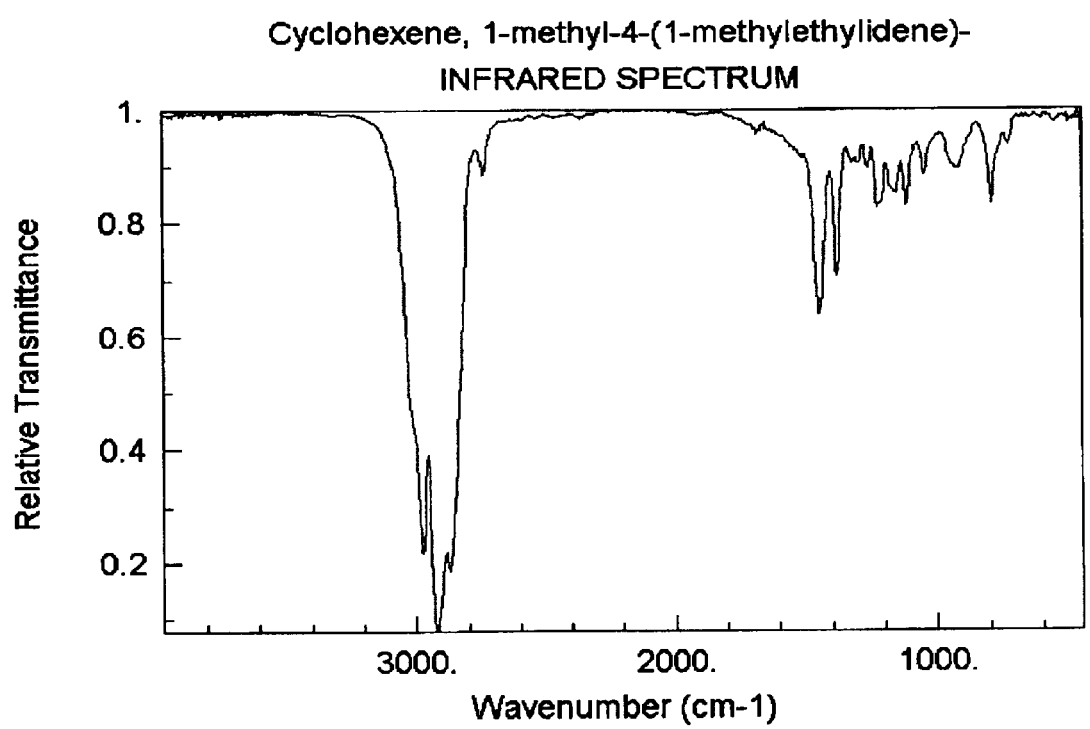
FIG. 3 is an infrared spectrum of ATP, a thermally labile group useful as a pore forming additive in the present invention.

A film was prepared and annealed substantially in accordance with Example 1A except that the anneal was conducted at a reduced temperature of 400° C. The infrared spectrum of the resulting film, including wavenumbers, is shown in FIG. 2. The infrared spectrum of the porogen, ATP, is shown in FIG. 3 for comparison.

Example 1D (Comparative)

A film was prepared and annealed substantially in accordance with Example 1A except that no porogens were used. The film had a dielectric constant of 2.8, and a composition substantially identical to the annealed film of Example 1A (see Tables 1 and 2).

Example 1E (Comparative)

A film was prepared and annealed substantially in accordance with Example 1D except that the plasma power was 400 watts. The film had a dielectric constant of 2.8, and a composition substantially identical to the annealed film of Example 1A (see Tables 1 and 2).

Example 1F

A film was prepared and annealed substantially in accordance with Example 1A except that the process conditions were 1000 miligrams per minute (mgm) flow of a 75% (by volume) mixture of alpha-terpinene (ATP) in di-t-butoxymethylsilane (DtBOMS). A carrier gas flow of 500 sccm of $CO_2$ was used to escort the chemicals into the deposition chamber. Further process conditions were as follows: a chamber pressure of 7 Torr, wafer chuck temperature of 215° C., showerhead to wafers spacing of 0.30 inches, and plasma power of 400 watts for a period of 240 seconds. The film as deposited had a thickness of 540 nm and a dielectric constant of 2.8. The film was annealed at 425° C. under nitrogen for 4 hours to remove substantially all the incorporated alpha-terpinene. The annealed film had a thickness of 474 nm and a dielectric constant of 2.10. The modulus and hardness were 2.23 and 0.18 GPa, respectively.

Example 1 G

ATP was co-deposited with DtBOMS onto a silicon wafer via PECVD in an oxidant-free environment. The process conditions were 700 miligrams per minute (mgm) flow of a 75% (by volume) mixture of ATP in DtBOMS. A carrier gas flow of 500 sccm of $CO_2$ was used to escort the chemicals into the deposition chamber. Further process conditions were as follows: a chamber pressure of 9 Torr, wafer chuck temperature of 275° C., showerhead to wafers spacing of 0.30 inches, and plasma power of 600 watts for a period of 240 seconds. The film as deposited had a thickness of 670 nm and a dielectric constant of 2.64. The film was annealed at 425° C. under nitrogen for 4 hours to remove substantially all the incorporated ATP. The annealed film had a thickness of 633 nm and a dielectric constant of 2.19. The modulus and hardness were 3.40 and 0.44 GPa, respectively.

Example 2

The second route investigated to produce low k films with k<2.6 used a single source organosilane precursor which included a thermally labile organic functionality as part of the molecular structure. The potential advantage of attaching the thermally labile group to a silica precursor is improved incorporation of the thermally labile group into the film. In order to investigate this route, we synthesized the molecule neo-hexyl-tetramethylcyclotetrasiloxane (neo-hexyl-TMCTS), in which a neo-hexyl group was grafted onto the TMCTS framework. The process conditions used in this test were 500 mgm flow of neohexyl-TMCTS and a carrier gas flow of 500 sccm of $CO_2$, a chamber pressure of 6 Torr, wafer chuck temperature of 150° C., showerhead to wafers spacing of 0.32 inches, and plasma power of 300 watts for a period of 90 seconds. Thickness of the as-deposited film was 1120 nm with a dielectric constant of 2.7. The film was annealed at 425° C. for 4 hours under $N_2$. Film thickness was reduced to 710 nm and the dielectric constant to 2.5. Films deposited from the TMCTS at 150° C. had a dielectric constant as-deposited of 2.8, which did not change after thermal annealing at 425° C. for 4 hours.

Example 3

A third route investigated to produce low k films with k<2.6 was to physically mix an organosilicon precursor with a silica precursor having a large thermally labile group attached to it. To prove the efficacy of this route, fufuroxy-dimethylsilane was co-deposited with TMCTS at the following conditions; 1000 mgm flow of an 11% mixture of furfuroxydimethylsilane in TMCTS and a carrier gas flow of 500 sccm of He, a chamber pressure of 6 Torr, wafer chuck temperature of 150° C., showerhead to wafers spacing of 0.26 inches, and plasma power of 300 watts for a period of 40 seconds. Thickness of the as-deposited film was 1220 nm with a dielectric constant of 3.0. The inclusion of the furfuroxy was indicated by FTIR in the as-deposited films. After thermal post-treatments at 400° C. in nitrogen for 1 hour the k was reduced to 2.73. It is likely in this case that there was remaining a significant portion of the incorporated furfuroxy groups even after thermal anneal.

The preceding examples indicate the ability to incorporate a variety of functional groups into as-deposited films, and more critically the importance of the proper choice of the porogen to enable materials with k<2.6. A variety of other porogens can also function using these routes. To provide optimum low dielectric constant materials with k <2.6 requires good network-forming organosilane/organosiloxane precursors which can provide the proper type and amount of organic-group incorporation in the OSG network. It is preferred that network-forming precursors which do not require the addition of oxidant to produce OSG films be used. This is of particular importance when using hydrocarbon-based pore-forming precursors which are susceptible to oxidation. Oxidation may cause significant modification of the pore-former during deposition which could hamper its ability to be subsequently removed during annealing processes.

TABLE 1

| | | XPS Data | | | | |
|---|---|---|---|---|---|---|
| Example | Description | C | O | N | Si | Conditions |
| 1A | DEMS-ATP | 51.8 | 25.6 | ND | 22.6 | 150° C., 300 W |
| 1A | Annealed | 24.5 | 43.1 | ND | 32.4 | 425° C., 4 hrs. |
| 1E | DEMS | 28.8 | 38.8 | ND | 32.4 | 150° C., 400 W |
| 1E | Annealed | 25.1 | 41.4 | ND | 33.5 | 425° C., 4 hrs. |
| 1D | DEMS | 27.0 | 40.6 | ND | 32.4 | 150° C., 300 W |
| 1D | Annealed | 23.4 | 42.7 | ND | 33.9 | 425° C., 4 hrs. | all compositional analysis after 30 sec Ar sputter to clean surface; inherent measurement error +/− 2 atomic %.
Note: Hydrogen cannot be determined by XPS; atomic compositions shown are normalized without hydrogen

TABLE 2

Film Property Data

| Example | Description | K | Refractive Index | Δ Thickness (%) | H (GPa) | M (GPa) |
|---------|-------------|---|------------------|-----------------|---------|---------|
| 1D; 1E | Various DEMS (as-deposited) | 2.9–3.1 | 1.435 | — | 0.30–0.47 | 2.4–3.5 |
| 1D; 1E | Various DEMS (post-treated) | 2.80 | 1.405 | 7–10 | — | — |
| 1A | DEMS-ATP (as-deposited) | 2.80 | 1.490 | — | — | — |
| 1A | DEMS-ATP (post-treated) | 2.41 | 1.346 | 22 | 0.36 | 3.2 |
| 1B | DEMS-ATP (as-deposited) | 2.59 | | | | |
| 1F | DEMS-ATP (post-treated) | 2.14 | | 16 | | |
| 1F | DtBOMS-ATP (as-deposited) | 2.80 | 1.491 | — | — | — |
| 1F | DtBOMS-ATP (post-treated) | 2.10 | 1.315 | 12 | 0.18 | 2.2 |
| 1G | DtBOMS-ATP (as-deposited) | 2.64 | 1.473 | — | — | — |
| 1G | DtBOMS-ATP (post-treated) | 2.19 | 1.334 | 5.5 | 0.44 | 3.4 |

Note: all depositions performed at 150° C., hardness (H) and modulus (M) determined by nanoindentation.

Comparison of the IR spectrum of as-deposited and $N_2$ thermal post-treated DEMS/ATP films shows that thermal post-treatment in an inert atmosphere is successful for selective removal of porogen and retention of the OSG lattice. There is essentially no change in the $S_1$—$CH_3$ absorption at 1275 cm$^{-1}$ after thermal anneal (the $S_1$—$CH_3$ is associated with the OSG network). However, there is seen a dramatic reduction in C—H absorptions near 3000 cm$^{-1}$ suggesting that essentially all the carbon associated with ATP has been removed. The IR spectrum for ATP is shown for reference in FIG. 3. An added benefit of this anneal appears to be a significant reduction in the Si—H absorption at 2240 and 2170 cm$^{-1}$ which should render the film more hydrophobic.

Compositional analysis indicates that the DEMS-ATP film after anneal at 425° C. for 4 hrs (Example 1A) has essentially identical composition to a DEMS films deposited and annealed in the same manner (Example 1 D). The DEMS-ATP film prior to anneal indicates a substantially larger amount of carbon-based material in the film (IR analysis supports that this carbon-based material is very similar to ATP—see FIG. 3). This supports the assertion that the porogen material incorporated into a DEMS film when co-deposited with ATP is essentially completely removed by the thermal post-treatment process. Thermogravimetric analysis (FIG. 4) further indicates that significant weight loss of the as-deposited material is experienced when heated to temperatures above 350° C., which is additional proof of porogen removal during annealing. The observed film shrinkage is likely caused by collapse of some portion of the OSG network upon removal of the porogen. However, there is little loss of organic groups from the OSG network, i.e., terminal methyl groups within the DEMS are mostly retained (see the XPS data of pre and post thermal treatment for DEMS film shown in Table 1). This is supported by the relatively equivalent $S_1$—$CH_3$ bands at ~1275 wavenumbers in the IR spectrum. Hydrophobicity of this material is substantiated by the lack of Si—OH groups in the IR spectrum. The decrease in refractive index and dielectric constants of the films post-annealing suggests that they are less dense than the pre-annealed film, despite the decrease in film thickness. Positron Annihilation Lifetime Spectroscopy (PALS) indicates pore sizes for samples 1A, 1 B, and 1 F in the range of ~1.5 nm equivalent spherical diameter. Also, unlike the work of Grill et al (referenced in the introduction), analysis of the thickness loss in conjunction with the compositional change (Example 1A) indicates that the OSG network is retained during anneal and not significantly degraded.

The present invention has been set forth with regard to several preferred embodiments, but the scope of the present invention is considered to be broader than those embodiments and should be ascertained from the claims below.

What is claimed is:

1. A chemical vapor deposition method for producing a porous organosilica glass film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, said method comprising:

providing a substrate within a vacuum chamber;

introducing into the vacuum chamber gaseous reagents including at least one precursor gas selected from the group consisting of an organosilane and an organosiloxane, and a porogen distinct from the at least one precursor gas;

applying energy to the gaseous reagents in the vacuum chamber to induce reaction of the gaseous reagents to deposit a preliminary film on the substrate, wherein the preliminary film contains the porogen, and the preliminary film is deposited without added oxidants; and removing from the preliminary film substantially all of the porogen to provide the porous film with pores and a dielectric constant less than 2.6.

2. The method of claim 1, wherein the dielectric constant is less than 2.4.

3. The method of claim 1, wherein the dielectric constant is less than 2.2.

4. The method of claim 1, wherein the dielectric constant is less than 1.9.

5. The method of claim 1, wherein v is from 20 to 30 atomic %, w is from 20 to 45 atomic %, x is from 5 to 20 atomic %, y is from 15 to 40 atomic % and z is 0.

6. The method of claim 1, wherein z is 0.5 to 7 atomic %.

7. The method of claim 6, wherein at least one fluorination agent selected from the group consisting of $SiF_4$, $NF_3$, $F_2$ and HF is used to introduce F to the porous film, and substantially all F in the porous film is bonded to Si in Si—F groups.

8. The method of claim 1, wherein most of the hydrogen in the porous film is bonded to carbon.

9. The method of claim 1, wherein the porous film has a density less than 1.5 g/ml.

10. The method of claim 1, wherein the porous film has a density less than 1.25 g/ml.

11. The method of claim 1, wherein the pores have an equivalent spherical diameter less than or equal to 5 nm.

12. The method of claim 1, wherein the pores have an equivalent spherical diameter less than or equal to 2.5 nm.

13. The method of claim 1, wherein the substrate is a semiconductor.

14. The method of claim 1, wherein the porous film is an insulation layer, an interlayer dielectric layer, an intermetal dielectric layer, a capping layer, a chemical-mechanical planarization or etch stop layer, a barrier layer or an adhesion layer in an integrated circuit.

15. The method of claim 1, wherein the gaseous reagents further include at least one porogenated precursor gas selected from the group consisting of an organosilane and an organosiloxane.

16. The method of claim 1, wherein a Fourier transform infrared (FTIR) spectrum of the porous film is substantially identical to a reference FTIR of a reference film prepared by a process substantially identical to the method except for a lack of any porogen.

17. The method of claim 16, wherein the porous film has a dielectric constant at least 0.3 less than a reference dielectric constant of the reference film.

18. The method of claim 16, wherein the porous film has a density at least 10% less than a reference density of the reference film.

19. The method of claim 1, wherein the porous film has an average weight loss of less than 1.0 wt %/hr isothermal at 425° C. under $N_2$.

20. The method of claim 1, wherein the porous film has an average weight loss of less than 1.0 wt %/hr isothermal at 425° C. under air.

21. The method of claim 1, wherein the porous film is adapted to adhere to silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, copper, aluminum, TiN, Ti(C)N TaN, Ta(C)N, Ta, W and WN sufficiently to pass ASTM Standard D3359-95a tape pull test.

22. The method of claim 1, wherein the at least one precursor gas is represented by the formula $R^1{}_n(OR^2)4-n$ Si where $R^1$ is independently H or a linear or branched, saturated, singly or multiply unsaturated, cyclic, partially or fully fluorinated $C_1$ to $C_4$ hydrocarbon, $R_2$ is independently a $C_1$ to $C_6$ linear or branched, saturated, singly or multiply unsaturated, cyclic, aromatic, partially or fully fluorinated hydrocarbon, and n is 1 to 3, with the proviso that there is not more than one Si—H per Si atom.

23. The method of claim 1, wherein the at least one precursor gas is represented by the formula $R^1{}_n(OR^2)_{3-n}$Si—O—SiR$^3{}_m$(OR$^4$)$_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^4$ are independently $C_1$ to $C_6$ linear or branched, saturated, singly or multiply unsaturated, cyclic, aromatic, partially or fully fluorinated hydrocarbon, n is 1 to 3 and m is 1 to 3, with the proviso that there is not more than one Si—H per Si atom.

24. The method of claim 1, wherein the at least one precursor gas is represented by the formula $R^1{}_n(OR^2)_{3-n}$Si—SiR$^3{}_m$(OR$^4$)$_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^4$ are independently $C_1$ to $C_6$ linear or branched, saturated, singly or multiply unsaturated, cyclic, aromatic, partially or fully fluorinated hydrocarbon, n is 1 to 3 and m is 1 to 3, with the proviso that there is not more than one Si—H per Si atom.

25. The method of claim 1, wherein the at least one precursor gas is represented by the formula $R^1{}_n(O(O)CR^2)_{4-n}$Si where $R^1$ is independently H or a linear or branched, saturated, singly or multiply unsaturated, cyclic, partially or fully fluorinated $C_1$ to $C_4$ hydrocarbon, $R_2$ is independently H, $C_1$ to $C_6$ linear or branched, saturated, singly or multiply unsaturated, cyclic, aromatic, partially or fully fluorinated hydrocarbon, and n is 1 to 3, with the proviso that there is not more than one Si—H per Si atom.

26. The method of claim 1, wherein the at least one precursor gas is represented by the formula $R^1{}_n(O(O)CR^2)_{3-n}$Si—O—SiR$^3{}_m$(O(O)CR$^4$)$_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^4$ are independently H, $C_1$ to $C_6$ linear or branched, saturated, singly or multiply unsaturated, cyclic, aromatic, partially or fully fluorinated hydrocarbon, n is 1 to 3 and m is 1 to 3, with the proviso that there is not more than one Si—H per Si atom.

27. The method of claim 1, wherein the at least one precursor gas is represented by the formula $R^1{}_n(O(O)CR^2)_{3-n}$Si—SiR$^3{}_m$(O(O)CR$^4$)$_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^4$ are independently H, $C_1$ to $C_6$ linear or branched, saturated, singly or multiply unsaturated, cyclic, aromatic, partially or fully fluorinated hydrocarbon, n is 1 to 3 and m is 1 to 3, with the proviso that there is not more than one Si—H per Si atom.

28. The method of claim 1, wherein the at least one precursor gas is represented by the formula $R^1{}_n(O(O)CR^2)_{3-n}$Si—O—SiR$^3{}_m$(OR$^4$)$_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ is independently H, $C_1$ to $C_6$ linear or branched, saturated, singly or multiply unsaturated, cyclic, aromatic, partially or fully fluorinated hydrocarbon; and $R^4$ is independently $C_1$ to $C_6$ linear or branched, saturated, singly or multiply unsaturated, cyclic, aromatic, partially or fully fluorinated hydrocarbon, n is 1 to 3 and m is 1 to 3, with the proviso that there is not more than one Si—H per Si atom.

29. The method of claim 1, wherein the at least one precursor gas is represented by the formula $R^1{}_n(O(O)CR^2)_{3-n}$Si—SiR$^3{}_m$(OR$^4$)$_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ is independently H, $C_1$ to $C_6$ linear or branched, saturated, singly or multiply unsaturated, cyclic, aromatic, partially or fully fluorinated hydrocarbon; and $R^4$ is independently $C_1$ to $C_6$ linear or branched, saturated, singly or multiply unsaturated, cyclic, aromatic, partially or fully fluorinated hydrocarbon, n is 1 to 3 and m is 1 to 3, with the proviso that there is not more than one Si—H per Si atom.

30. The method of claim 1, wherein the at least one precursor gas is represented by the formula $R^1{}_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 1 to 3, with the proviso that there is not more than one Si—H per Si atom.

31. The method of claim 1, wherein the at least one precursor gas is represented by the formula $R^1{}_n(OR^2)_p(O(O)CR^4)_{3-n-p}Si$—O—$SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 1 to 3, m is 1 to 3, q is 1 to 3 and p is 1 to 3, with the proviso that there is not more than one Si—H per Si atom.

32. The method of claim 1, wherein the at least one precursor gas is represented by the formula $R^1{}_n(OR2)_p(O(O)CR^4)_{3-n-p}Si$—$SiR^3{}_m(O(O)CR^5)_q(OR^6)_{3-m-q}$ where $R^1$ and $R^3$ are independently H or $C^1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 1 to 3, m is 1 to 3, q is 1 to 3 and p is 1 to 3, with the proviso that there is not more than one Si—H per Si atom.

33. The method of claim 1, wherein the at least one precursor gas is represented by cyclic siloxanes of the formula $(OSiR_1R_3)_x$, where $R^1$ and $R^3$ can be independently H, $C_1$ to $C_4$, linear or branched, saturated, singly or multiply unsaturated, cyclic, partially or fully fluorinated, and x may be any integer from 2 to 8, with the proviso that there is not more than one Si—H per Si atom.

34. The method of claim 1, wherein the at least one precursor gas is a member selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyidi-t-butoxysilane, 1,3,5,7-tetramethylcyclotatrasiloxane, octamethylcyclotetrasiloxane and tetraethoxysilane.

35. The method of claim 1, wherein a mixture of organosilanes or organosiloxanes are used.

36. The method of claim 1, wherein said at least one precursor gas is a mixture of a first organosilicon precursor with two or fewer Si—O bonds with a second organosilicon precursor with three or more Si—O bonds, and the mixture is provided to tailor a chemical composition of the porous film.

37. The method of claim 1, wherein the porogen is at least one cyclic hydrocarbon having a cyclic structure and the formula $C_nH_{2n}$, where n is 4 to 14, a number of carbons in the cyclic structure is between 4 and 10, and the at least one cyclic hydrocarbon optionally contains a plurality of simple or branched hydrocarbons substituted onto the cyclic structure.

38. The method of claim 1, wherein the porogen is at least one singly or multiply unsaturated cyclic hydrocarbon having a cyclic structure and the formula $C_nH_{2n-2x}$, where x is a number of unsaturated sites, n is 4 to 14, a number of carbons in the cyclic structure is between 4 and 10, and the at least one singly or multiply unsaturated cyclic hydrocarbon optionally contains a plurality of simple or branched hydrocarbons substituents substituted onto the cyclic structure, and contains unsaturation inside endocyclic or on one of the hydrocarbon substituents.

39. The method of claim 1, wherein the porogen is at least one bicyclic hydrocarbon having a bicyclic structure and the formula $C_nH_{2n-2}$, where n is 4 to 14, a number of carbons in the bicyclic structure is from 4 to 12, and the at least one bicyclic hydrocarbon optionally contains a plurality of simple or branched hydrocarbons substituted onto the bicyclic structure.

40. The method of claim 1, wherein the porogen is at least one multiply unsaturated bicyclic hydrocarbon having a bicyclic structure and the formula $C_nH_{2n-(2+2x)}$, where x is a number of unsaturated sites, n is 4 to 14, a number of carbons in the bicyclic structure is from 4 to 12, and the at least one multiply unsaturated bicyclic hydrocarbon optionally contains a plurality of simple or branched hydrocarbons substituents substituted onto the bicyclic structure, and contains unsaturation inside endocyclic or on one of the hydrocarbon substituents.

41. The method of claim 1, wherein the porogen is at least one tricyclic hydrocarbon having a tricyclic structure and the formula $C_nH_{2n-4}$, where n is 4 to 14, a number of carbons in the tricyclic structure is from 4 to 12, and the at least one tricyclic hydrocarbon optionally contains a plurality of simple or branched hydrocarbons substituted onto the cyclic structure.

42. The process of claim 1, wherein the porogen is a member selected from the group consisting of alpha-terpinene, limonene, cyclohexane, 1,2,4-trimethylcyclohexane, 1,5-dimethyl-1,5-cyclooctadiene, camphene, adamantane, 1,3-butadiene, substituted dienes and decahydronaphthelene.

43. The method of claim 1, wherein the at least one precursor and at least one porogen are introduced into the vacuum chamber from distinct sources.

44. The method of claim 1, wherein the at least one precursor and at least one porogen are introduced into the vacuum chamber as a mixture.

45. The method of claim 1, wherein the energy provides the gaseous reagents in a plasma, pulsed plasma, helicon plasma, high density plasma, inductively coupled plasma, capacitively coupled plasma or remote plasma.

46. The method of claim 45, wherein a secondary rf frequency source is used to modify plasma characteristics at a surface of the substrate.

47. The method of claim 1, wherein the gaseous reagents are carried in the vacuum chamber by a carrier gas containing carbon dioxide.

48. The method of claim 1, wherein the porogen removing is accomplished by at least one member selected from the group consisting of thermal annealing, plasma treating, photocuring, chemical treating and microwaving.

49. The method of claim 1, wherein the porogen removing is accomplished by thermal treatment between 250 and 450° C. in a nitrogen atmosphere with less than 50 ppm oxygen.

50. The method of claim 1, wherein the porogen removing is accomplished by at least one member selected from the group consisting of thermal annealing, plasma treating, photocuring and microwaving in an inert atmosphere comprising at least one inert gas, wherein a concentration of oxidizing gases is less than 50 parts per million.

51. The method of claim 1, wherein the porogen removing is accomplished by at least one member selected from the group consisting of thermal annealing, plasma treating, photocuring and microwaving in an oxidizing atmosphere comprising at least one gas, wherein a concentration of oxidizing gases is greater than 50 parts per million.

52. A chemical vapor deposition method for producing an organosilica glass film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, said method comprising:
  providing a substrate within a vacuum chamber;
  introducing into the vacuum chamber gaseous reagents including at least one precursor gas selected from the group consisting of a organosilane and an organosiloxane, wherein the at least one precursor gas contains at least one porogen bonded thereto;
  applying energy to the gaseous reagents in the vacuum chamber to induce reaction of the gaseous reagents to deposit a preliminary film on the substrate, wherein the preliminary film contains the at least one porogen and a first quantity of methyl groups bonded to silicon atoms; and
  removing from the preliminary film at least a portion of the at least one porogen to provide the porous film with pores and a dielectric constant less than 2.6, wherein the porous film contains a second quantity of methyl groups bonded to silicon atoms, and the second quantity is more than 50% of the first quantity.

53. The method of claim 52, wherein the gaseous reagents further include at least one porogen-free precursor gas selected from the group consisting of an organosilane and an organosiloxane.

54. The method of claim 52, wherein the removing step removes from the film substantially all of the porogen.

55. The method of claim 52, wherein the removing step leaves a methyl group attached to Si where the porogen was previously attached.

56. The method of claim 52, wherein the dielectric constant is less than 2.4.

57. The method of claim 52, wherein the dielectric constant is less than 2.2.

58. The method of claim 52, wherein the dielectric constant is less than 1.9.

59. The method of claim 52, wherein v is from 20 to 30 atomic %, w is from 20 to 45 atomic %, x is from 5 to 20 atomic %, y is from 15 to 40 atomic % and z is 0.

60. The method of claim 52, wherein z is 0.5 to 7 atomic %.

61. The method of claim 60, wherein at least one fluorination agent selected from the group consisting of $SiF_4$, $NF_3$, $F_2$ $COF_2$, $CO_2F_2$ and HF is used to introduce F to the porous film, and substantially all F in the porous film is bonded to Si in Si—F groups.

62. The method of claim 52, wherein most of the hydrogen in the porous film is bonded to carbon.

63. The method of claim 52, wherein the porous film has a density less than 1.5 g/ml.

64. The method of claim 52, wherein the porous film has a density less than 1.25 g/ml.

65. The method of claim 52, wherein the pores have an equivalent spherical diameter less than or equal to 5 nm.

66. The method of claim 52, wherein the pores have an equivalent spherical diameter less than or equal to 2.5 nm.

67. The method of claim 52, wherein the substrate is a semiconductor.

68. The method of claim 52, wherein the porous film is an insulation layer, an interlayer dielectric layer, an intermetal dielectric layer, a capping layer, a chemical-mechanical planarization or etch stop layer, a barrier layer or an adhesion layer in an integrated circuit.

69. The method of claim 52, wherein a Fourier transform infrared (FTIR) spectrum of the porous film is identical to a reference FTIR of a reference film prepared by a process identical to the method except for a lack of any porogen.

70. The method of claim 69, wherein the porous film has a dielectric constant at least 0.3 less than a reference dielectric constant of the reference film.

71. The method of claim 69, wherein the porous film has a density at least 10% less than a reference density of the reference film.

72. The method of claim 52, wherein the porous film has an average weight loss of less than 1.0 wt %/hr isothermal at 425° C. under $N_2$.

73. The method of claim 52, wherein the porous film has an average weight loss of less than 1.0 wt %/hr isothermal at 425° C. under air.

74. The method of claim 52, wherein the at least one precursor gas is represented by the formula $R^1_n(OR^2)_{4-n}Si$ where $R^1$ is independently H or a linear or branched, saturated, singly or multiply unsaturated, cyclic, partially or fully fluorinated $C_1$ to $C_{12}$ hydrocarbon, $R_2$ is independently a $C_1$ to $C_{12}$ linear or branched, saturated, singly or multiply unsaturated, cyclic, aromatic, partially or fully fluorinated hydrocarbon, and n is 1 to 3, with the provisos that there is not more than one Si—H per Si atom and that one of $R^1$ and $R^2$ is substituted with a $C_3$ or larger hydrocarbon as the porogen.

75. The method of claim 52, wherein the at least one precursor gas is represented by the formula $R^1_n(OR\ 2)_{4-n}$ Si—O—$SiR^3_m(OR^4)_{4-m}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently $C_1$ to $C_{12}$ linear or branched, saturated, singly or multiply unsaturated, cyclic, aromatic, partially or fully fluorinated hydrocarbon, n is 1 to 3 and m is 1 to 3, with the provisos that there is not more than one Si—H per Si atom and that one of $R^1$ and $R^3$ is substituted with a $C_3$ or larger hydrocarbon as the porogen.

76. The method of claim 52, wherein the at least one precursor gas is represented by the formula $R^1_n(OR^2)_{4-n}$ Si—$SiR^3_m(OR^4)_{4-m}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently $C_1$ to $C_{12}$ linear or branched, saturated, singly or multiply unsaturated, cyclic, aromatic, partially or fully fluorinated hydrocarbon, n is 1 to 3 and m is 1 to 3, with the provisos that there is not more than one Si—H per Si atom and that one of $R^1$ and $R^3$ is substituted with a $C_3$ or larger hydrocarbon as the porogen.

77. The method of claim 52, wherein the at least one precursor gas is represented by the formula $R^1_n(O(O)$ $CR^2)_{4-n}Si$ where $R^1$ is independently H or a linear or branched, saturated, singly or multiply unsaturated, cyclic, partially or fully fluorinated $C_1$ to $C_{12}$ hydrocarbon, $R_2$ is independently a $C_1$ to $C_{12}$ linear or branched, saturated, singly or multiply unsaturated, cyclic, aromatic, partially or fully fluorinated hydrocarbon, and n is 1 to 3, with the provisos that there is not more than one Si—H per Si atom and that one of $R_1$ and $R^3$ is substituted with a $C_3$ or larger hydrocarbon as the porogen.

78. The method of claim 52, wherein the at least one precursor gas is represented by the formula $R^1{}_n(O(O)CR^2)_{4-n}Si$—O—$SiR^3{}_m(O(O)CR^4)_{4-m}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently $C_1$ to $C_{12}$ linear or branched, saturated, singly or multiply unsaturated, cyclic, aromatic, partially or fully fluorinated hydrocarbon, n is 1 to 3 and m is 1 to 3, with the provisos that there is not more than one Si—H per Si atom and that one of $R^1$ and $R^3$ is substituted with a $C_3$ or larger hydrocarbon as the porogen.

79. The method of claim 52, wherein the at least one precursor gas is represented by the formula $R^1{}_n(O(O)CR^2)_{4-n}Si$—$SiR^3{}_m(O(O)CR^4)_{4-m}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently $C_1$ to $C_{12}$ linear or branched, saturated, singly or multiply unsaturated, cyclic, aromatic, partially or fully fluorinated hydrocarbon, n is 1 to 3 and m is 1 to 3, with the provisos that there is not more than one Si—H per Si atom and that one of $R^1$ and $R^3$ is substituted with a $C_3$ or larger hydrocarbon as the porogen.

80. The method of claim 52, wherein the at least one precursor gas is represented by the formula $R^1{}_n(O(O)CR^2)_{4-n}Si$—O—$SiR^3{}_m(OR^4)_{4-m}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently $C_1$ to $C_{12}$ linear or branched, saturated, singly or multiply unsaturated, cyclic, aromatic, partially or fully fluorinated hydrocarbon, n is 1 to 3 and m is 1 to 3, with the provisos that there is not more than one Si—H per Si atom and that one of $R^1$ and $R^3$ is substituted with a $C_3$ or larger hydrocarbon as the porogen.

81. The method of claim 52, wherein the at least one precursor gas is represented by the formula $R^1{}_n(O(O)CR^2)_{4-n}Si$—$SiR^3{}_m(OR^4)_{4-m}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently $C_1$ to $C_{12}$ linear or branched, saturated, singly or multiply unsaturated, cyclic, aromatic, partially or fully fluorinated hydrocarbon, n is 1 to 3 and m is 1 to 3, with the provisos that there is not more than one Si—H per Si atom and that one of $R^1$ and $R^3$ is substituted with a $C_3$ or larger hydrocarbon as the porogen.

82. The method of claim 52, wherein the at least one precursor gas is represented by the formula $R^1{}_n(OR^2)_p(O(O)CR^3)_{4-(n+p)}Si$ where $R^1$ is independently H or $C_1$ to $C_{12}$ linear or branched, saturated, singly or multiply unsaturated, cyclic, partially or fully fluorinated hydrocarbon; $R^2$ and $R^3$ are independently $C_1$ to $C_{12}$ linear or branched, saturated, singly or multiply unsaturated, cyclic, aromatic, partially or fully fluorinated hydrocarbon, n is 1 to 3 and p is 1 to 3, with the provisos that there is not more than one Si—H per Si atom and that one of $R^1$ and $R^3$ is substituted with a $C_3$ or larger hydrocarbon as the porogen.

83. The method of claim 52, wherein the at least one precursor gas is represented by the formula $R^1{}_n(OR^2)_p(O(O)CR^4)_{4-n-p}Si$—O—$SiR^3{}_m(O(O)CR^5)_q(OR^6)_{4-m-q}$ where $R^1$ and $R^3$ are independently H or $C_1$ to $C_{12}$ linear or branched, saturated, singly or multiply unsaturated, cyclic, partially or fully fluorinated hydrocarbon; $R^2$, $R^4$, $R^5$ and $R^6$ are independently $C_1$ to $C_{12}$ linear or branched, saturated, singly or multiply unsaturated, cyclic, aromatic, partially or fully fluorinated hydrocarbon, n is 1 to 3, m is 1 to 3, q is 1 to 3 and p is 1 to 3, with the provisos that there is not more than one Si—H per Si atom and that one of $R^1$ and $R^3$ is substituted with a $C_3$ or larger hydrocarbon as the porogen.

84. The method of claim 52, wherein the at least one precursor gas is represented by the formula $R^1{}_n(OR^2)_p(O(O)CR^4)_{4-n-p}Si$—$SiR^3{}_m(O(O)CR^5)_q(OR^6)_{4-m-q}$ where $R^1$ and $R^3$ are independently H or $C_1$ to $C_{12}$ linear or branched, saturated, singly or multiply unsaturated, cyclic, partially or fully fluorinated hydrocarbon; $R^2$, $R^4$, $R^5$ and $R^6$ are independently $C_1$ to $C_{12}$ linear or branched, saturated, singly or multiply unsaturated, cyclic, aromatic, partially or fully fluorinated hydrocarbon, n is 1 to 3, m is 1 to 3, q is 1 to 3 and p is 1 to 3, with the provisos that there is not more than one Si—H per Si atom and that one of $R^1$ and $R^3$ is substituted with a $C_3$ or larger hydrocarbon as the porogen.

85. The method of claim 52, wherein the at least one precursor gas is represented by the formula $R^1{}_n(OR^2)_{4-n}Si$—$R^5$—$SiR^3{}_m(OR^4)_{4-m}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently $C_1$ to $C_{12}$ linear or branched, saturated, singly or multiply unsaturated, cyclic, aromatic, partially or fully fluorinated hydrocarbon, $R^5$ is independently $C_1$ to $C_{12}$, linear or branched, saturated, singly or multiply unsaturated, cyclic, partially or fully fluorinated hydrocarbon, and bridges the two Si atoms, n is 1 to 3 and m is 1 to 3, with the provisos that there is not more than one Si—H per Si atom and that at least one of $R^1$, $R^3$ and $R^5$ is substituted with a $C_3$ or larger hydrocarbon as the porogen.

86. The method of claim 52, wherein the at least one precursor gas is represented by cyclic siloxanes of the formula $(OSiR_1R_3)_x$, where $R^1$ and $R^3$ are independently H or $C_1$ to $C_{12}$ linear or branched, saturated, singly or multiply unsaturated, cyclic, partially or fully fluorinated hydrocarbon, and x is any integer from 2 to 8, with the proviso that there is not more than one Si—H per Si atom.

87. The method of claim 52, wherein the at least one precursor gas is a member selected from the group consisting of 1-neohexyl-1,3,5,7-tetramethylcyclotetrasiloxane, 1-neopentyl-1,3,5,7-tetramethylcyclotetrasiloxane, neopentyldiethoxysilane, neohexyldiethoxysilane, neohexyltriethoxysilane, neopentyltriethoxysilane and neopentyl-di-t-butoxysilane.

88. The method of claim 52, wherein a mixture of organosilanes or organosiloxanes are used.

89. The method of claim 52, wherein said at least one an precursor gas is a mixture of an organosilicon precursor with two or fewer Si—O bonds with an organosilicon precursor with three or more Si—O bonds, and the mixture is provided to tailor a chemical composition of the porous film.

90. The method of claim 52, wherein the porogen is at least one member selected from the group consisting of tert-butyl, neopentyl and neohexyl.

91. The method of claim 52, wherein the energy provides the gaseous reagents in a plasma, pulsed plasma, helicon plasma, high density plasma, inductively coupled plasma, capacitively coupled plasma or remote plasma.

92. The method of claim 91, wherein a secondary rf frequency source is used to modify plasma characteristics at a surface of the substrate.

93. The method of claim 52, wherein the gaseous reagents are carried in the vacuum chamber by a carrier gas containing carbon dioxide.

94. The method of claim 52, wherein the porogen removing is accomplished by at least one member selected from the group consisting of thermal annealing, plasma treating, photocuring, chemical treating and microwaving.

95. The method of claim 52, wherein the porogen removing is accomplished by thermal treatment in a nitrogen atmosphere with less than 50 ppm oxygen.

96. The method of claim 52, wherein the porogen removing is accomplished by at least one member selected from the group consisting of thermal annealing, plasma treating, photocuring and microwaving in an inert atmosphere comprising at least one inert gas, wherein the concentration of oxidizing gases is less than 50 parts per million.

97. The method of claim 52, wherein the porogen removing is accomplished by at least one member selected from the group consisting of thermal annealing, plasma treating, photocuring and microwaving in an oxidizing atmosphere comprising at least one gas, wherein the concentration of oxidizing gases is greater than 50 parts per million.

98. The method of claim 52, wherein process conditions are altered during said method to provide the porous film with at least one of a porosity gradient and layers of differing porosities.

99. The method of claim 1, wherein process conditions are altered during said method to provide the porous film with at least one of a porosity gradient and layers of differing porosities.

* * * * *

UNITED STATES PATENT AND TRADEMARK OFFICE
CERTIFICATE OF CORRECTION

PATENT NO. : 6,846,515 B2
DATED : January 25, 2005
INVENTOR(S) : Raymond Nicholas Vrtis et al.

It is certified that error appears in the above-identified patent and that said Letters Patent is hereby corrected as shown below:

Column 25,
Line 8, delete "$R_1$" and substitute therefore -- $R^1$ --.

Signed and Sealed this

Nineteenth Day of April, 2005

JON W. DUDAS
*Director of the United States Patent and Trademark Office*

UNITED STATES PATENT AND TRADEMARK OFFICE
CERTIFICATE OF CORRECTION

PATENT NO.    : 6,846,515 B2
DATED         : January 25, 2005
INVENTOR(S)   : Raymond Nicholas Vrtis et al.

It is certified that error appears in the above-identified patent and that said Letters Patent is hereby corrected as shown below:

Column 21,
Line 60, delete the word "dimethyidi-t-butoxysilane" and substitute therefore
-- dimethyldi-t-butoxysilane --.

Signed and Sealed this

Thirty-first Day of May, 2005

JON W. DUDAS
*Director of the United States Patent and Trademark Office*